(12) United States Patent
Federici et al.

(10) Patent No.: US 7,977,777 B2
(45) Date of Patent: Jul. 12, 2011

(54) LEAD FRAME THERMOPLASTIC SOLAR CELL RECEIVER

(75) Inventors: Domenico J. Federici, San Antonio, TX (US); Richard Schneider, Livonia, MI (US); Michael P. Jasmin, North Dartmouth, MA (US)

(73) Assignee: Interplex Industries, Inc., College Point, NY (US)

( * ) Notice: Subject to any disclaimer, the term of this patent is extended or adjusted under 35 U.S.C. 154(b) by 70 days.

(21) Appl. No.: 12/472,286

(22) Filed: May 26, 2009

(65) Prior Publication Data
US 2009/0298218 A1 Dec. 3, 2009

Related U.S. Application Data

(60) Provisional application No. 61/055,888, filed on May 23, 2008.

(51) Int. Cl.
*H01L 31/024* (2006.01)
(52) U.S. Cl. ......... 257/675; 257/E21.499; 257/E31.117; 257/E31.127; 438/65; 438/122
(58) Field of Classification Search .................. 257/666, 257/675–676, E21.499, E31.117, E31.127; 438/57, 64–65, 121–124
See application file for complete search history.

(56) References Cited

U.S. PATENT DOCUMENTS

| | | | | |
|---|---|---|---|---|
| 5,118,361 A | * | 6/1992 | Fraas et al. | 136/246 |
| 2003/0002820 A1 | * | 1/2003 | Nakanishi et al. | 385/88 |
| 2004/0070062 A1 | | 4/2004 | Letterman et al. | |
| 2005/0046006 A1 | * | 3/2005 | Yeom | 257/686 |
| 2005/0236699 A1 | | 10/2005 | Chapman | |
| 2005/0285236 A1 | | 12/2005 | Sasser et al. | |
| 2009/0120499 A1 | * | 5/2009 | Prather et al. | 136/259 |
| 2009/0159125 A1 | * | 6/2009 | Prather et al. | 136/259 |
| 2009/0159128 A1 | * | 6/2009 | Shook et al. | 136/259 |
| 2010/0148196 A1 | * | 6/2010 | Kamada et al. | 257/98 |

FOREIGN PATENT DOCUMENTS

| | | | | |
|---|---|---|---|---|
| JP | 02156645 A | * | 6/1990 | |
| JP | 10335556 A | * | 12/1998 | |

* cited by examiner

*Primary Examiner* — Matthew Smith
*Assistant Examiner* — Michele Fan
(74) *Attorney, Agent, or Firm* — Weingarten, Schurgin, Gagnebin & Lebovici LLP

(57) ABSTRACT

A lead frame thermoplastic package for a solar cell, and a method of manufacturing the same. The lead frame being either a single-lead frame design or a dual-lead frame design. The single-lead frame design being made up of a single-lead metal frame. The dual-lead frame design being made up of a die pad lead frame, a wire bond lead frame, and being encapsulated in a thermoplastic resin. Optionally, the single lead frame or at least one of the dual-lead frames is coated with a dielectric material. The lead frame providing connections for a semiconductor die, a diode, and the associated electrical connections. The lead frame also providing a large surface area metal pad for cooling, and mounting tabs for securing various optics systems to the package. Optionally, the lead frame is incorporated into a solar cell including the lead frame, a semiconductor die, a diode, an optics system, and an integrated electrical connection system.

17 Claims, 11 Drawing Sheets

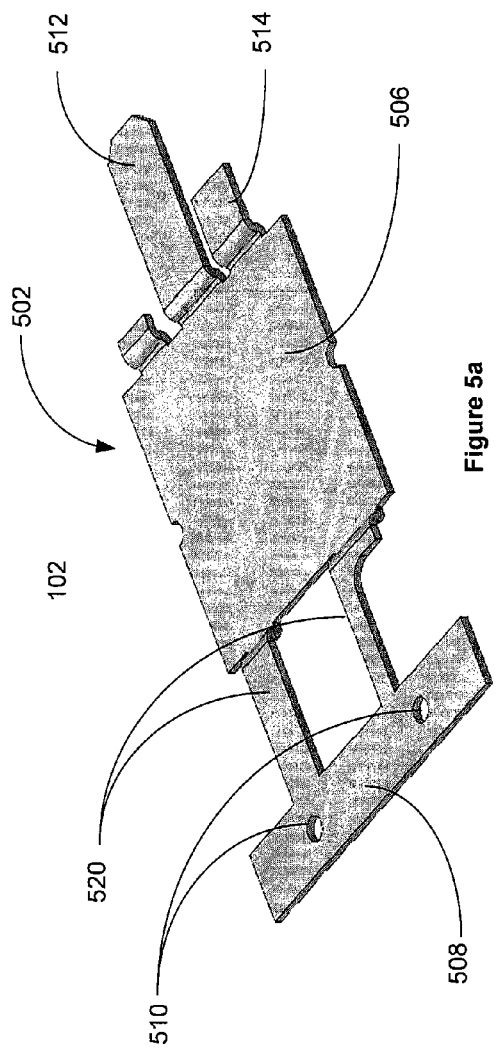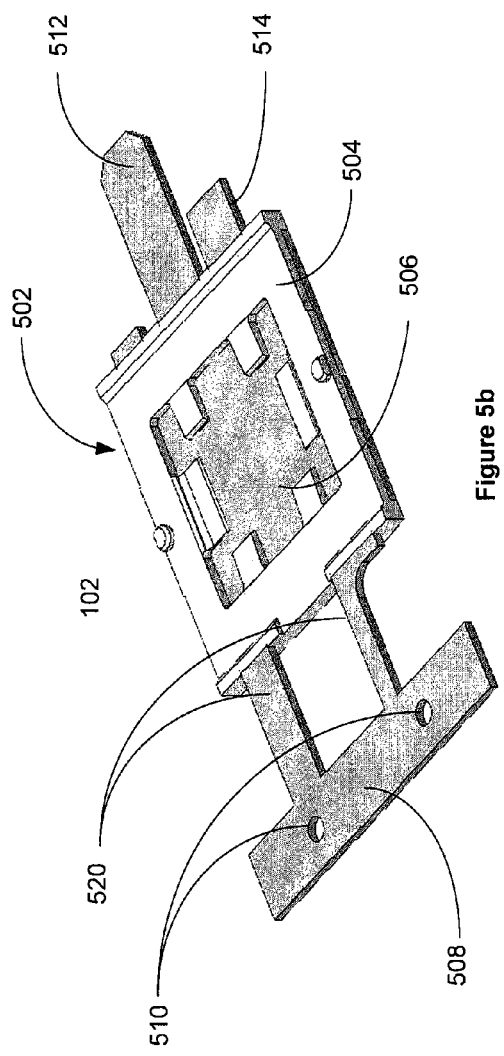

LEAD FRAME THERMOPLASTIC SOLAR CELL RECEIVER

CROSS-REFERENCE TO PRIOR APPLICATIONS

This application claims the benefit of U.S. Provisional Patent Application No. 61/055,888, filed May 23, 2008, which is hereby incorporated by reference in its entirety.

FIELD OF INVENTION

The present invention generally relates to leads and connectors. Specifically, the present invention relates to lead frames for solar cells.

BACKGROUND OF THE INVENTION

Rising oil costs and increasing concerns regarding environmental issues have placed greater emphasis on the pursuit of sustainable, renewable, alternative energy. This pursuit has fueled research for alternative energy in numerous different fields. Although many sources of alternative energy are available, some believe that the most viable sources of renewable alternative energy are wind power and solar power. Within solar power technology, different methods for harnessing the sun's energy are available. The more widely known type of solar power is solar thermal technology, which concentrates the sun's energy to heat a heat-transfer fluid. Solar thermal technology is employed in the solar power plants installed in the Mojave Desert in the western United States.

An alternate technology to solar thermal technology available for generating electricity from solar energy is Concentrated Photovoltaics ("CPV"). Unlike solar thermal technology, CPV directly converts sunlight into electricity. Although CPV technology has been widely known for years, it remained in the shadow of solar thermal technology until NASA incorporated CPV modules into its spacecraft.

CPV is regarded by some as the most promising utility-scale sustainable form of alternative renewable energy. Historically, CPV technology has yielded efficiency percentages in the mid to upper teens. However, with advances in technology, forecasters estimate that CPV has the potential of reaching and exceeding efficiencies of greater than 50%. One impediment to achieving higher efficiencies has been inadequate heat dissipation of CPV solar cells. The technology surrounding packaging of CPV chips has not kept pace with advances that have been achieved in CPV chip technology. These packages do not allow for sufficient cooling of CPV chips to achieve higher efficiencies.

Many CPV applications still use copper bonded ceramic substrate packages, known as direct copper bonding ("DBC"), for mounting CPV chips. DBC packages are made up of sheet copper bonded to ceramic plates, and is widely used in spacecraft applications. Although the design of these packages is well-established and stable, the packages are costly and inefficient. Furthermore, CPV technology typically utilizes a variety of optics systems to concentrate the incident solar energy. These optics systems typically incorporate large heavy lenses to focus incoming solar energy. These lenses are typically custom design units that are difficult to mount onto the existing and widely used DBC substrate packages.

SUMMARY OF THE INVENTION

The present invention is directed to a lead frame for a solar cell, and a method of manufacturing the same. The package provides a low-cost, efficient lead frame that includes a mechanism to allow the mounting of various optics systems.

An exemplary embodiment of a lead frame according to the present invention includes a coupled assembly having a die pad lead frame coupled to a wire bond lead frame, and the coupled assembly is encapsulated in a thermoplastic molding. Optionally, the die pad lead frame or the wire bond lead frame (or both lead frames) may be coated with a dielectric material. The die pad lead frame includes a stamped metal base and a plastic frame. The metal base is configured to have at least one protrusion that is configured to provide electrical signals, and a second protrusion that is configured to optionally receive a diode, or any other electrical component. The wire bond lead frame includes pads to provide electrical connections for a semiconductor die, protrusions that are configured to provide electrical connections, and mounting tabs configured to optionally receive an optics system. Additional structure may be included to allow for the mounting of additional components that may be required.

In another exemplary embodiment of a lead frame according to the present invention, the lead frame includes a single stamped lead frame, with electrical isolation within the frame introduced later in the manufacturing process. In this embodiment, the single stamped lead frame includes the features of both the die pad lead frame and the wire bond lead frame described above for the dual-lead frame, and the single frame is encapsulated in a thermoplastic molding. After the frame has been encapsulated in the thermoplastic molding, the electrical isolation within the single stamping is introduced through a process such as debussing.

The lead frame according to the present invention include a large surface area metal pad that, in conjunction with the thermoplastic encapsulation, is configured to allow sufficient heat dissipation and cooling of the solar cell. Further, optional mounting tabs allow the mounting of optics systems that are used in CPV applications to concentrate incoming solar energy. The thermoplastic molding may also include mounting features to accommodate various optics systems such as prisms, Fresnel lenses, and other light focusing systems.

An optional aspect of the present invention includes carrier strips that can be attached to both the die pad lead frame and the wire bond lead frame. The carrier strips allow handling of the lead frames and the package using automated machinery. Furthermore, the carrier strips can be configured so that they provide accurate registration of the die pad lead frame and the wire bond lead frame as they are coupled together.

An exemplary embodiment of a method of producing a dual-lead frame for a solar cell according to the present invention includes stamping a die pad lead frame and a wire bond lead frame. The method includes plating the frames with a metal and coupling a plastic frame to the die pad lead frame. The die pad lead frame is then coupled to the wire bond lead frame, and the coupled frames are encapsulated in a thermoplastic resin.

In an alternative embodiment of a method of producing a lead frame for a solar cell according to the present invention, the lead frame is produced from a single stamped frame. After the single frame is stamped, the frame is plated with a metal, preferably nickel, and encapsulated in a thermoplastic resin. Electrical isolation is later introduced within the single frame through a process such as debussing.

Optionally, in accordance with another aspect of the present invention, the method can be continued to produce a CPV solar cell. In continuing the method, a semiconductor die and a diode are mounted to the frame. Wire bonding, direct lead bonding, or other mounting techniques may be used to provide the electrical connections to the semiconductor die, and the diode is bonded to the frame. Afterwards, the mounting tabs are adjusted, and an optional thermal film, paste, ceramic spray or other thermal material is applied to the underside of the package. Finally, an optics system is installed onto the package, and the entire package is encapsulated in a material such as silicone.

These and other aspects, features, steps and advantages can be further appreciated from the accompanying figures and description of certain illustrative embodiments.

BRIEF DESCRIPTION OF THE DRAWINGS

The present invention will be more readily understood from the detailed description of exemplary embodiments presented below considered in conjunction with the accompanying drawings, in which:

FIG. 5a is a perspective illustration of a die pad lead frame of a dual-lead frame Concentrated Photovoltaic ("CPV") solar cell package in accordance with an embodiment of the present invention;

FIG. 5b is a perspective illustration of a die pad lead frame of a dual-lead frame Concentrated Photovoltaic ("CPV") solar cell package in accordance with an embodiment of the present invention;

DETAILED DESCRIPTION

The present invention is directed to a lead frame thermoplastic package for a solar cell, and a method of assembling the same.

Figure 1:
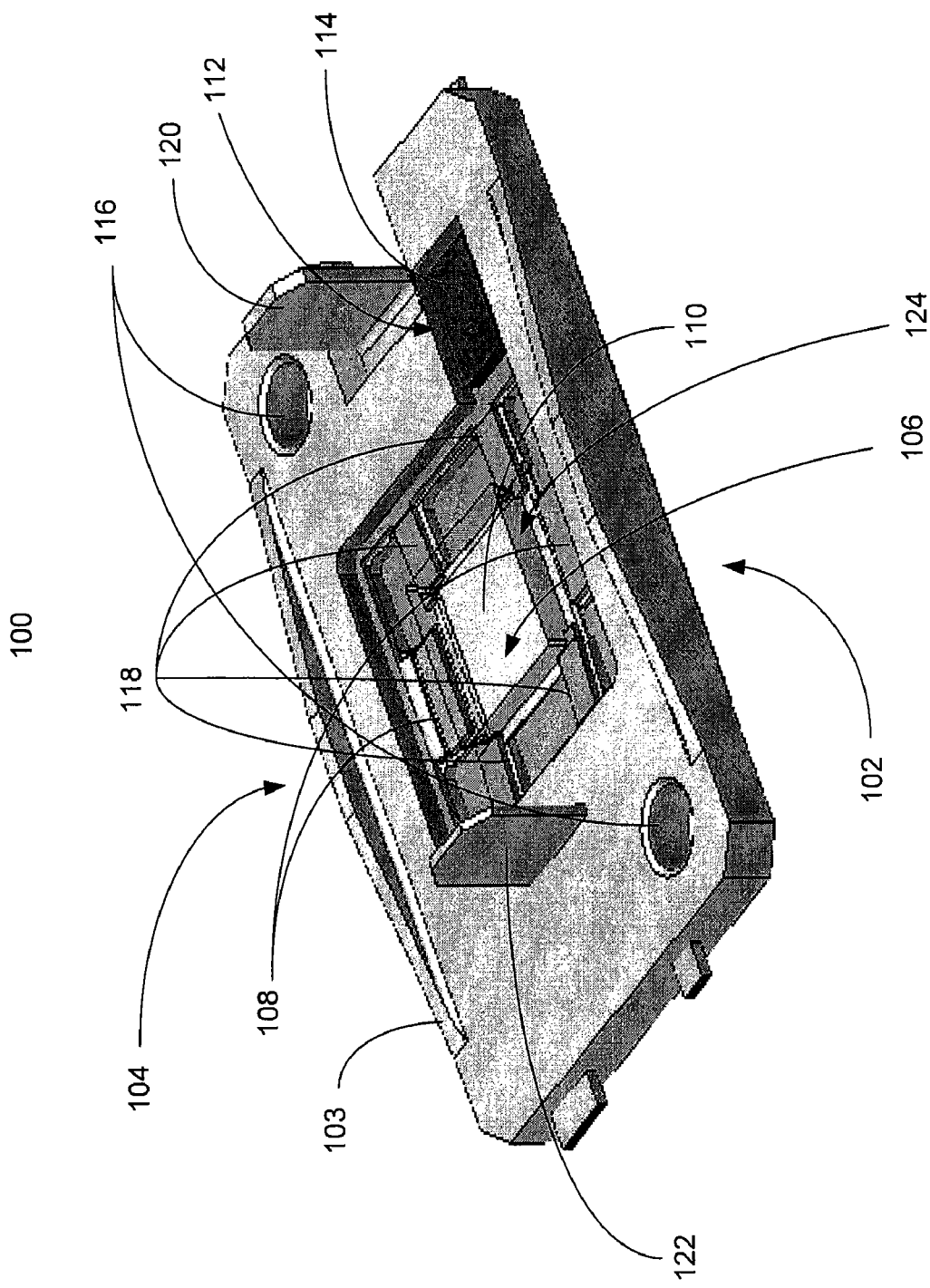
FIG. 1 is a perspective illustration of a dual-lead frame Concentrated Photovoltaic ("CPV") solar cell package in accordance with an embodiment of the present invention.

FIG. 1 is a perspective view illustration of a dual-lead frame 100 for a solar cell according to an embodiment of the present invention. The dual-lead frame 100 may be used for mounting a semiconductor die, a diode, and an optics system of a CPV solar cell. The dual-lead frame 100 may be made up of two frames, a die-pad lead frame 102, and a wire bond lead frame 104, and may be encapsulated in a thermoplastic molding 103. Optionally, the die-pad lead frame 102, or the wire bond lead frame 104, or both the die-pad lead frame 102 and the wire bond lead frame 104 may be coated with a dielectric material. The dielectric coating may be tape based, powder based, ink based, etc. During assembly of the dual-lead frame 100, the entire assembly is encapsulated in a thermoplastic molding 103 after the die-pad lead frame 102 and the wire bond lead frame 104 have been coupled to each other. The dual-lead frame 100 includes features that allow the alignment, assembly, and mounting of necessary hardware, and any corresponding electrical connections, for an operational CPV solar cell, while also allowing the solar cell to effectively dissipate heat. In addition to CPV applications, the dual-lead frame 100 may also be used in applications such as high brightness light emitting diode ("LED") applications, where thermal dissipation can also be an issue.

The dual-lead frame 100 may include a recess 106 and pads 108 to accommodate the mounting of a semiconductor die 110. Accordingly, the semiconductor die 110 can be mounted in the recess 106, and the semiconductor die 110 may be wire bonded to the pads 108 to provide the necessary electrical connections between the semiconductor die 110, and the dual-lead frame 100. Each wire bonded connection may be made up of a plurality of individual wires. The dual-lead frame 100 may also include a pad 112, onto which a diode 114 may be mounted. Although the semiconductor die 110 and the diode 114 are not part of the dual-lead frame 100, they are mounted onto the dual-lead frame 100 in assembling a CPV solar cell, and are illustrated in FIG. 1 for context and completeness. Additionally, the dual-lead frame 100 may include tabs 120 and 122 that provide electrical connections to the solar cell. Furthermore, the dual-lead frame 100 may also include a large surface-area metal pad (not shown) that can be mounted onto a heat spreader device via mounting holes 116 to ensure sufficient cooling of the dual-lead frame 100 and any mounted components, such as the semiconductor die 110 and the diode 114.

Figure 3:
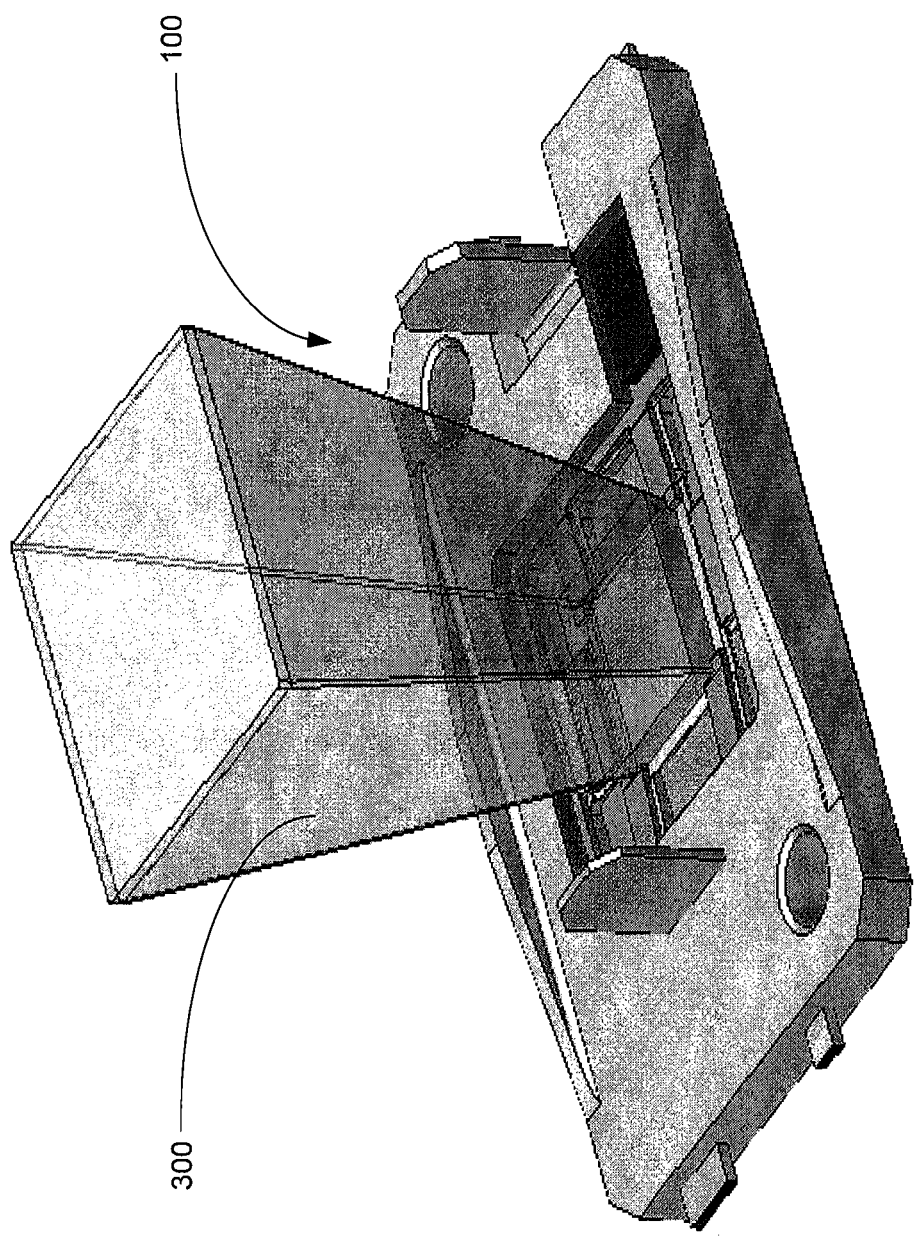
FIG. 3 is a perspective illustration of a Concentrated Photovoltaic ("CPV") solar cell in accordance with an embodiment of the present invention.

In addition to the structure that allows for the mounting of the semiconductor die 110 and the diode 114, the dual-lead frame 100 may include prism mounting tabs 118 and a well 124 to provide a mechanism to mount an optics system (not shown) to the dual-lead frame 100. An optics system 300 mounted to the dual-lead frame 100 is shown in FIG. 3 in accordance with an embodiment of the present invention. The optics system 300 may include a prism, Fresnel lenses, or a combination of Fresnel lenses and glass, or some other type of optics system that focuses incident solar energy onto the semiconductor die in a CPV solar cell application. Currently, many of the lenses and optics systems used in CPV applications are custom units, and thus are not standardized. Accordingly, the prism mounting tabs 118 and the well 124 can be designed or customized to accommodate virtually any lens or optics system that may be available or required for specific applications.

Figure 2B:
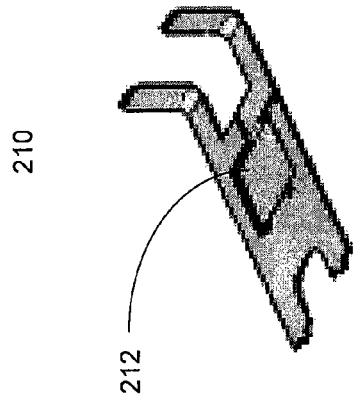
FIG. 2b is a perspective illustration of a single-lead metal frame of a single-lead frame Concentrated Photovoltaic ("CPV") solar cell package in accordance with an embodiment of the present invention.
Figure 2D:
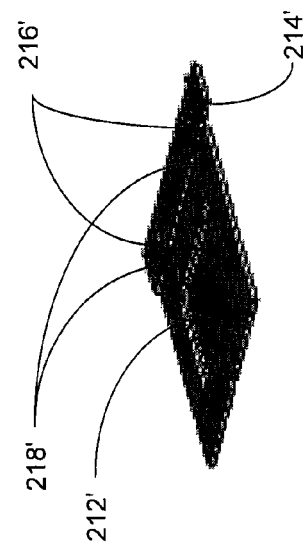
FIG. 2d is a perspective illustration of a single-lead metal frame of a single-lead frame Concentrated Photovoltaic ("CPV") solar cell package in accordance with an embodiment of the present invention.
Figure 2A:
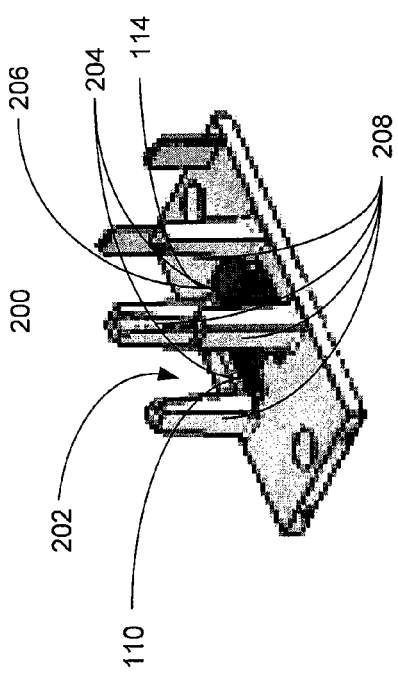
FIG. 2a is a perspective illustration of a single-lead frame Concentrated Photovoltaic ("CPV") solar cell package in accordance with an embodiment of the present invention.

FIG. 2a is a perspective view illustration of a single-lead frame 200 for a solar cell according to an embodiment of the present invention. The single-lead frame 200 is similar to the dual-lead frame 100, but is made up of a single-lead metal frame 210. As with the dual-lead frame 100, the single-lead frame 200 may be used for mounting a semiconductor die, a diode, and an optics system of a CPV solar cell. The single-lead frame 200 may include many similar features to those that are included in the dual-lead frame 100, such as features that allow the alignment, assembly, and mounting of necessary hardware, and any corresponding electrical connections, for an operational CPV solar cell, while also allowing the solar cell to effectively dissipate heat. As with the dual-lead frame 100, in addition to CPV applications, the single-lead frame 200 may also be used in applications such as high brightness light emitting diode ("LED") applications, where thermal dissipation can also be an issue.

The single-lead frame 200 may include a recess 202 and pads 204 to accommodate the mounting of a semiconductor die 110. Accordingly, the semiconductor die 110 can be mounted in the recess 202, and the semiconductor die 110 may be wire bonded to the pads 204 to provide the necessary electrical connections between the semiconductor die 110, and the single-lead frame 200. Each wire bonded connection may be made up of a plurality of individual wires. The single-lead frame 200 may also include a pad 206, onto which a diode 114 may be mounted. Although the semiconductor die 110 and the diode 114 are not part of the single-lead frame 200, they are mounted onto single-lead frame 200 in assembling a CPV solar cell, and are illustrated in FIG. 2a for context and completeness. Additionally, the single-lead frame 200 may also include a large surface-area metal pad (not shown) that can be mounted onto a heat spreader device to ensure sufficient cooling of the single-lead frame 200 and any mounted components, such as the semiconductor die 110 and the diode 114.

In addition to the structure that allows for the mounting of the semiconductor die 110 and the diode 114, the dual-lead frame 100 may include prism mounting tabs 208 to provide a mechanism to mount an optics system (not shown) to the single-lead frame 200. The optics system may include a prism, Fresnel lenses, or a combination of Fresnel lenses and glass, or some other type of optics system that focuses incident solar energy onto the semiconductor die in a CPV solar cell application. Currently, many of the lenses and optics systems used in CPV applications are custom units, and thus are not standardized. Accordingly, the prism mounting tabs 208 can be designed or customized to accommodate virtually any lens or optics system that may be available or required for specific applications.

FIG. 2b is a perspective view illustration of an exemplary single-lead metal frame 210 according to an embodiment of the present invention. In the single-lead frame 200, the single-lead metal frame 210 provides the functionality of both the die-pad lead frame 102 and the wire bond lead frame 104 of the dual-lead frame 100. The single-lead metal frame 210 can be stamped from virtually any type of metal or metal alloy, and may be plated with a second type of metal. In one exemplary embodiment, the single-lead metal frame 210 may be stamped in copper and plated with nickel. The single-lead metal frame 210 may include a large surface area pad 212. The large surface area pad 212 provides heat spreading functionality, and may provide the structure similar to the large surface area metal pad 400 described below.

Additionally, the single-lead metal frame 210 may also include a detachable carrier strip (not shown). The carrier strip may allow the single-lead metal frame 210 to be handled by automated machinery during the manufacturing and/or assembly of the single-lead metal frame 210, and the single-lead frame 200. The carrier strip may be connected to the single-lead metal frame 210 via detachable extensions (not shown). In addition to connecting the carrier strip to the single-lead metal frame 210, the extensions may have cut-aways or some other feature that allows the carrier strip to be detached from the single-lead metal frame 210. Further, the single-lead metal frame 210 may be stamped so that the large surface area pad 212, and the carrier strip are formed on different, but parallel, planes.

Figure 2C:
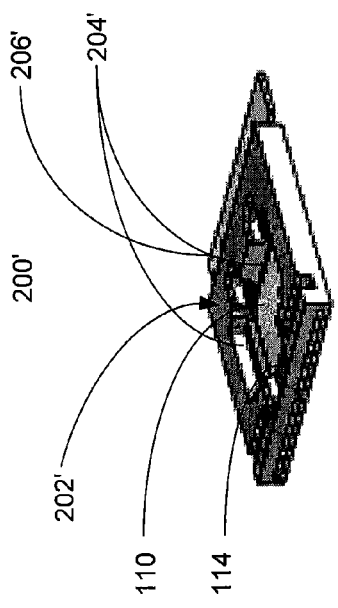
FIG. 2c is a perspective illustration of a single-lead frame Concentrated Photovoltaic ("CPV") solar cell package in accordance with an embodiment of the present invention.

FIG. 2c is a perspective view illustration of a single-lead frame 200' for a solar cell according to another embodiment of the present invention. The single-lead frame 200' is similar to the single-lead frame 200, but is of a different design and is made up of a single-lead metal frame 210'. As with the single-lead frame 200, the single-lead frame 200' may be used for mounting a semiconductor die, a diode, and an optics system of a CPV solar cell. The single-lead frame 200' may include many similar features to those that are included in the dual-lead frame 100 and the single-lead frame 200, such as features that allow the alignment, assembly, and mounting of necessary hardware, and any corresponding electrical connections, for an operational CPV solar cell, while also allowing the solar cell to effectively dissipate heat. As with the dual-lead frame 100 and the single-lead frame 200, in addition to CPV applications, the single-lead frame 200' may also be used in applications such as high brightness light emitting diode ("LED") applications, where thermal dissipation can also be an issue.

The single-lead frame 200' may include a recess 202' and pads 204' to accommodate the mounting of a semiconductor die 110. Accordingly, the semiconductor die 110 can be mounted in the recess 202', and the semiconductor die 110 may be wire bonded to the pads 204' to provide the necessary electrical connections between the semiconductor die 110, and the single-lead frame 200'. Each wire bonded connection may be made up of a plurality of individual wires. The single-lead frame 200' may also include a pad 206', onto which a diode 114 may be mounted. Although the semiconductor die 110 and the diode 114 are not part of the single-lead frame 200', they are mounted onto single-lead frame 200' in assembling a CPV solar cell, and are illustrated in FIG. 2c for context and completeness. Additionally, the single-lead frame 200' may also include a large surface-area metal pad (not shown) that can be mounted onto a heat spreader device to ensure sufficient cooling of the single-lead frame 200' and any mounted components, such as the semiconductor die 110 and the diode 114.

FIG. 2d is a perspective view illustration of an exemplary single-lead metal frame 210' according to an embodiment of the present invention. In the single-lead frame 200, the single-lead metal frame 210' provides the functionality of both the die-pad lead frame 102 and the wire bond lead frame 104 of the dual-lead frame 100. The single-lead metal frame 210' can be stamped from virtually any type of metal or metal alloy, and may be plated with a second type of metal. In one exemplary embodiment, the single-lead metal frame 210 may be stamped in copper and plated with nickel. The single-lead metal frame 210' may include a large surface area pad 212'. The large surface area pad 212' provides heat spreading functionality, and may provide the structure similar to the large surface area metal pad 400 described below.

Additionally, the single-lead metal frame 210' may also include a detachable carrier strip 214'. The carrier strip 214' may include holes 216' that allow the single-lead metal frame 210' to be handled by automated machinery during the manufacturing and/or assembly of the single-lead metal frame 210', and the single-lead frame 200'. Although the detachable carrier strip 214' is shown with two holes 216', it is not limited to two holes, but may include any number of holes that is required by a specific implementation of the present invention. The carrier strip 214' may be connected to the single-lead metal frame 210' via detachable extensions 218'. In addition to connecting the carrier strip 214' to the single-lead metal frame 210', the extensions 218' may have cut-aways or some other feature that allows the carrier strip 214' to be detached from the single-lead metal frame 210'. Furthermore, although the single-lead metal frame 210' with the carrier strip 214' is only shown with two detachable extensions 218', it is not limited to having only two detachable extensions. Further, the single-lead metal frame 210' may be stamped so that the large surface area pad 212', and the carrier strip are formed on different, but parallel, planes.

Figure 4:
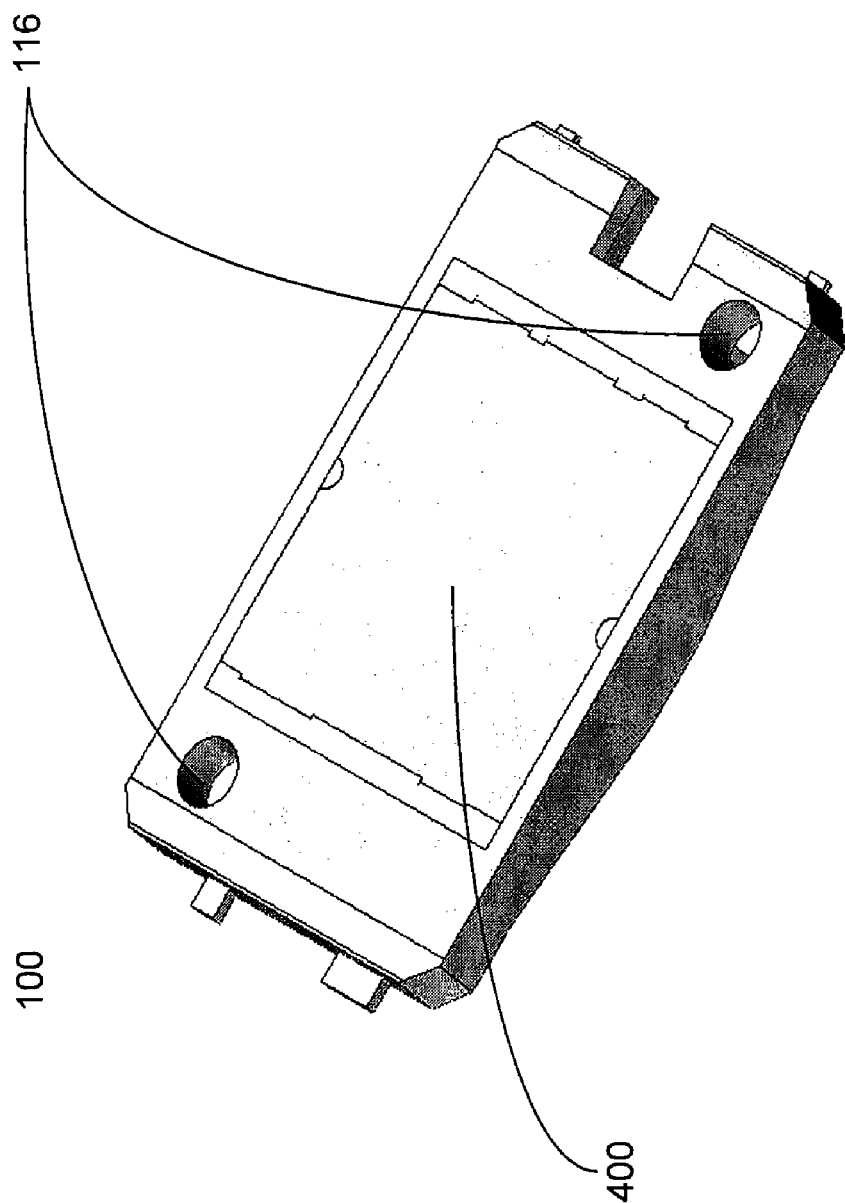
FIG. 4 is a perspective illustration of the underside of a Concentrated Photovoltaic ("CPV") solar cell package in accordance with an embodiment of the present invention.

FIG. 4 is a perspective view illustration of the dual-lead frame 100 for a solar cell according to an embodiment of the present invention. Although FIG. 4 illustrates the dual-lead frame 100 and the features will be described with respect to the dual-lead frame 100, the features described with respect to FIG. 4 are not limited to the dual-lead frame 100, and are also applicable to the single-lead frames 200 and 200'. The view in FIG. 4 of the dual-lead frame 100 shows an underside surface of the dual-lead frame 100 opposite the surface that is shown in FIG. 1. As shown in FIG. 4, the dual-lead frame 100 may include a large surface area metal pad 400 that provides heat spreading and dissipation functionality for the dual-lead frame 100. Preferably, the large surface-area metal pad is made from a material having a high thermal conductivity so it can effectively dissipate heat generated by the CPV solar cell. Although the illustration depicts the large surface area metal pad 400 to be rectangular, the shape of the large surface area metal pad is not limited to rectangular, but can be designed to be of any shape that is appropriate for various implementations of the dual-lead frame 100. For the single-lead frame 200 and 200', the structure of the feature corresponding to the large surface area metal pad 400 may be provided by the large surface area pad 212 and 212' of the single-lead metal frame 210 and 210', respectively. Additionally, the dual-lead frame 100 may also include mounting holes 116 so that the dual-lead frame 100 can be mounted to a another fixture, such as a secondary heat exchanging device such as a heat sink, or a fan, or an additional heat spreader plate to allow further cooling of the CPV solar cell packaged in the dual-lead frame 100.

FIGS. 5a and 5b are perspective view illustrations of an exemplary die pad lead frame 102 according to an embodiment of the present invention. FIG. 5b shows the die pad lead frame 102 which may be made up of a metal die pad 502 and a plastic frame 504. FIG. 5a shows the die pad lead frame 102 before the plastic frame 504 is coupled to the metal die pad 502. The metal die pad 502 can be stamped from virtually any type of metal or metal alloy, and may be plated with a second type of metal. In one exemplary embodiment, the metal die pad 502 may be stamped in copper and plated with nickel. The metal die pad 502 may include a large surface area pad 506. The large surface area pad 506 provides heat spreading functionality, and may provide the structure for the large surface area metal pad 400 described above. The metal die pad 502 may include protrusions 512 and 514. Although only two protrusions are illustrated in FIGS. 5a and 5b, metal die pad 502 is not limited to having only two protrusions, and can include any number of protrusions depending on the requirements of the implementation of the dual-lead frame 100. The protrusion 514 may form the structure of the pad 112 onto which the diode 114 is mounted. Further, the protrusion 512 can be bent so that it is in a vertical position. In this vertical position, the protrusion 512 may provide the structure of tab 120 of the dual-lead frame 100 as shown in FIG. 1, which provides electrical connections to the die pad lead frame 102 or wire bond lead frame 104. Further, the metal die pad 502 may be stamped so that the large surface area pad 506, the carrier strip 508, and the protrusions 512 and 514 are formed on different, but parallel, planes.

Additionally, the metal die pad 502 may also include a detachable carrier strip 508. The carrier strip 508 may include holes 510 that allow the metal die pad 502 to be handled by automated machinery during the manufacturing and/or assembly of the metal die pad 502, the die pad lead frame 102, and the dual-lead frame 100. Although the detachable carrier strip 508 is shown with two holes 510, it is not limited to two holes, but may include any number of holes that is required by a specific implementation of the present invention. The carrier strip 508 may be connected to the large surface area pad 506 via detachable extensions 520. In addition to connecting the carrier strip 508 to the large surface area pad 506, the extensions 520 may have cut-aways or some other feature that allows the carrier strip 508 to be detached from the die pad lead frame 102. Furthermore, although the die pad lead frame 102 with the carrier strip 508 is only shown with two detachable extensions 520, it is not limited to having only two detachable extensions.

FIG. 5b shows the die pad lead frame 102 having a plastic molding 504 that has been attached onto the metal die pad 502. The plastic frame 504 may be molded directly onto the metal die pad 502. Alternatively, the plastic frame 504 may be molded independent of the metal die pad 502, and may be coupled to the metal die pad 502 via fasteners or some other means. The plastic frame 504 insulates the die pad lead frame 102 from the wire bond lead frame 104, providing electrical isolation between the two lead frames.

Figure 6:
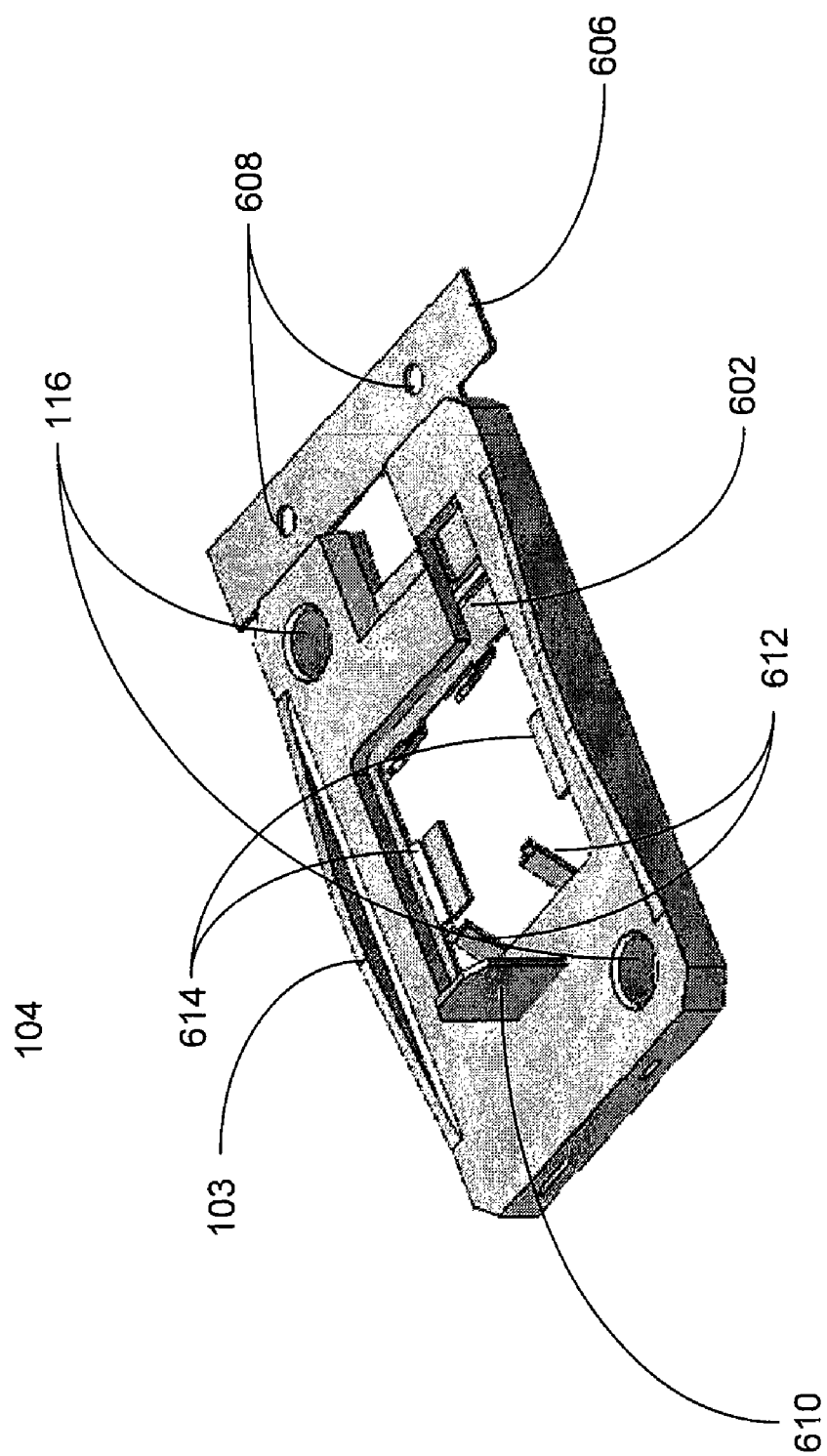
FIG. 6 is a perspective illustration of a wire bond lead frame of a dual-lead frame Concentrated Photovoltaic ("CPV") solar cell package in accordance with an embodiment of the present invention.

FIG. 6 is a perspective view illustration of an exemplary embodiment of a wire bond lead frame 104 according to an aspect of the present invention. In FIG. 6, the wire bound lead frame 104 is shown with the thermoplastic mold 103 that is molded onto the dual-lead frame 100 after the die pad lead frame 102 and the wire bound lead frame have been coupled together. Similar to the die pad lead frame, the wire bond lead frame 104 may be made up of a metal frame 602. The metal frame 602 can be stamped from virtually any type of metal or metal alloy, and may be plated with a second type of metal. In one exemplary embodiment, the metal frame 602 may be stamped in copper and plated with nickel. Further, the metal frame 602 may include a protrusion 610, tabs 612, and pads 614. The protrusion 610 can be bent so that it is in a vertical position. In the vertical position, the protrusion 610 may provide the structure of tab 122 of the dual-lead frame 100 as shown in FIG. 1, which provides electrical connections to the wire bond lead frame 104. Further, the pads 614 may provide the structure of pads 108 of the dual-lead frame 100 as shown in FIG. 1, and the tabs 612 may provide the structure of prism mounting tabs 118. Furthermore, the pads 614 may be plated with gold to form the pads 108 to provide the connections for the semiconductor die 110. FIG. 6 also illustrates the mounting holes 116 that allow the dual-lead frame 100 to be mounted to another structure, such as a heat spreader device.

As with the die pad lead frame 102, the metal frame 602 may also include a detachable carrier strip 606. The carrier strip 606 may include holes 608 that allow the metal die pad 602 to be handled by automated machinery during the manufacturing and/or assembly of the metal die pad 602, the wire bond lead frame 104, and the dual-lead frame 100. The carrier strip 606 may be connected to the metal frame 602 via detachable extensions (not visible). In addition to connecting the carrier strip 606 to the metal frame 602, the extensions may have cut-aways or some other feature that allow the carrier strip 606 to be detached from the metal frame 602. Furthermore, although the metal frame 602 and the carrier strip 606 is shown with two detachable extensions, it is not limited to having only two detachable extensions.

In addition to providing structure that may allow for the automated handling of the various components in the production of the dual-lead frame 100, the carrier strips 508 and 606 may be used to provide accurate registration between the die pad lead frame 102 and the wire bond lead frame 104. To perform this function, the detachable carrier strips 508 and 606 can be designed so that they are both located on the same side of the dual-lead frame 100. Thus, when the die pad lead frame 102 and the wire bond lead frame 104 are coupled together, the carrier strips 508 and 606 can be dimensioned so that the holes 510 and 608 of the carrier strips 508 and 606 are aligned. Accordingly, when the aligned holes 508 and 608 are handled by automated machinery, this results in automatic, accurate registration of the die pad lead frame 102 and the wire bond lead frame 104.

Figure 7:
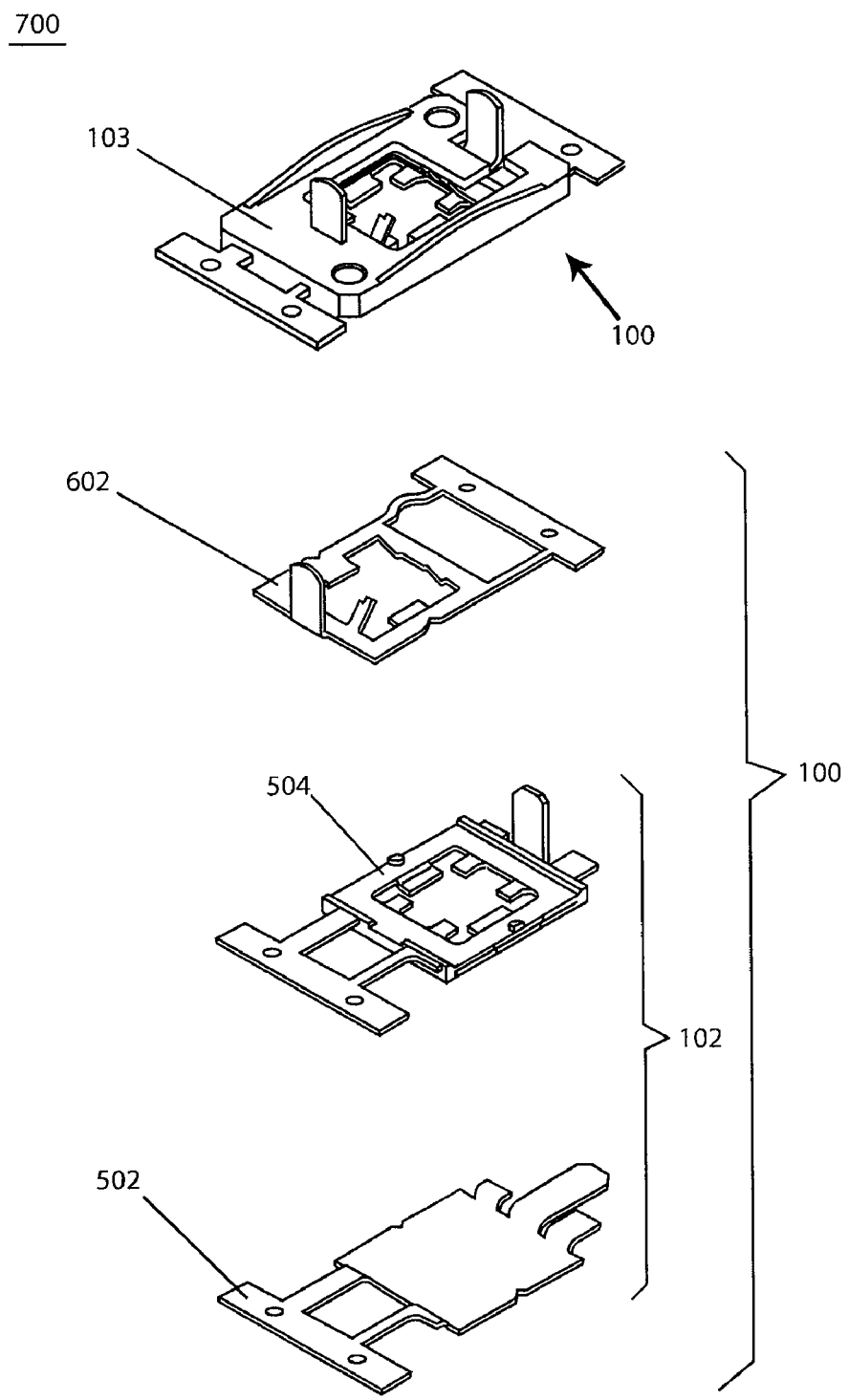
FIG. 7 is an exploded perspective illustration of a dual-lead frame Concentrated Photovoltaic ("CPV") solar cell package in accordance with an embodiment of the present invention.

FIG. 7 is an exploded view 700 of the dual-lead frame 100. The exploded view 700 illustrates the components that make up the dual-lead frame 100. The exploded view 700 shows the die pad lead frame 102, made up of the metal die pad 502 and the plastic molding 504, and the wire bond lead frame 104, made up of the metal frame 602, and the entire dual-lead frame 100 which may be encapsulated in thermoplastic molding 103.

Figure 8:
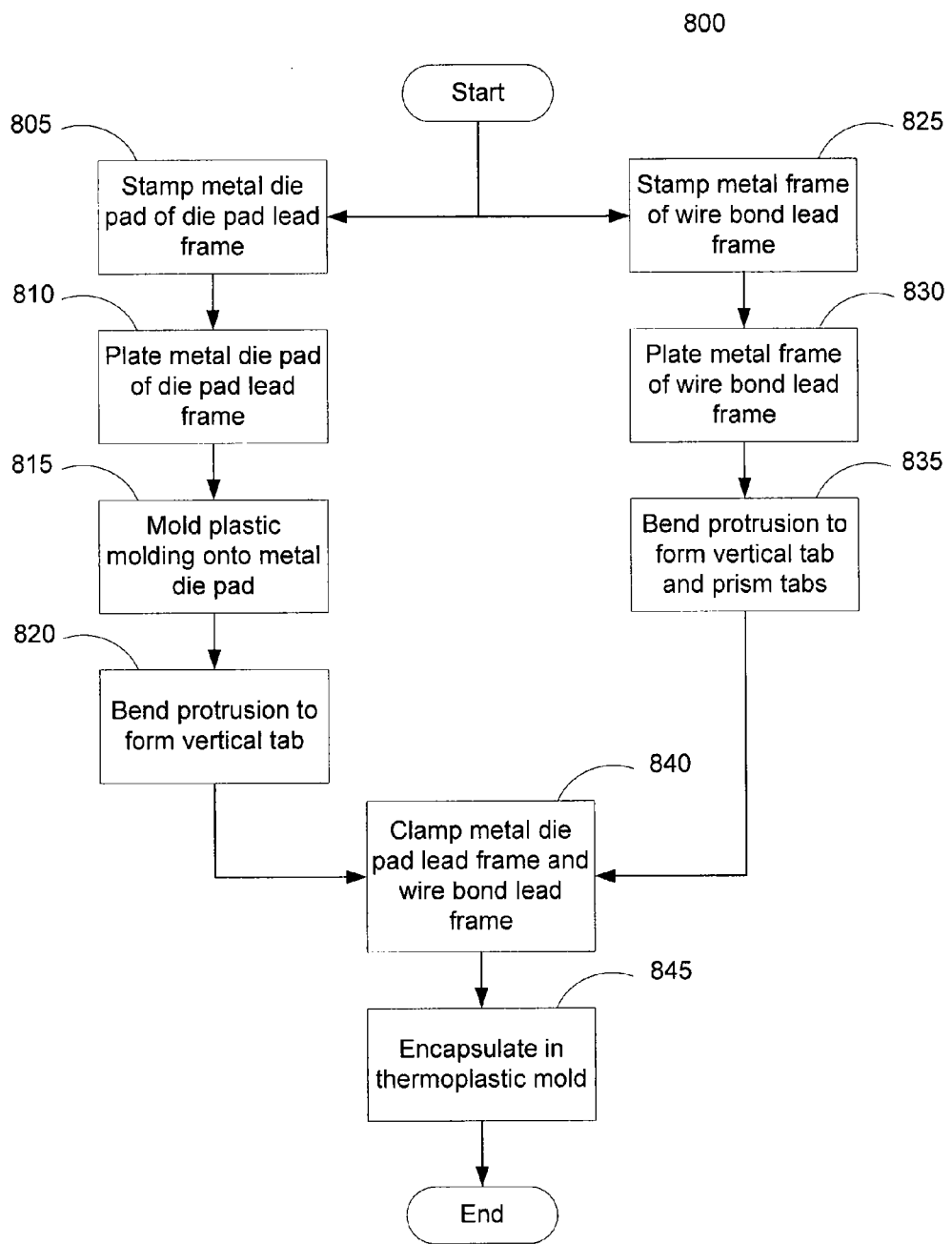
FIG. 8 is a flow diagram of a process of producing a dual-lead frame CPV solar cell package in accordance with an aspect of the present invention.

FIG. 8 is an exemplary flow diagram of a method 800 according to an embodiment of the present invention. The method 800 includes steps that can be performed in manufacturing the dual-lead frame 100. Although the steps of the method 800 will be described with respect to the dual-lead frame 100, the die pad lead frame 102, and the wire bond lead frame 104, the method 800 is not limited to the dual-lead frame 100, and is merely an exemplary embodiment in accordance with the present invention.

The method 800 includes steps 805-820 for assembling the die pad lead frame 102, and steps 825-835 for assembling the wire bond lead frame 104. Although the flow diagram illustrates these steps as being performed in parallel, these processes can be implemented serially, or independent of each other. To begin the process, the metal die pad 502 and the metal frame 602 are first stamped (steps 805 and 825), and then plated (steps 810 and 830). Optionally, the metal die pad 502, or the metal frame 602, or both the metal die pad 502 and the metal frame 602 may be coated with a dielectric material. As noted above, in an exemplary embodiment of the present invention, the plating metal that is used may be nickel for most of the frames, and gold for the protrusions 614 that form the pads 108. Next, a plastic is molded onto the metal die pad 502 of the die pad lead frame 102 (step 815). The protrusions 510 and 610 are then bent to provide the structure of tabs 120 and 122, and the protrusions 612 are bent, which provide the structure of the prism mounting tabs 118 (steps 820 and 835). After the protrusions 510, 610, and 612 are bent, the die pad lead frame 102 and the wire bond lead frame 104 are coupled together (step 840). Lastly, the entire assembly is encapsulated in the thermoplastic molding 103 (step 845).

Figure 9:
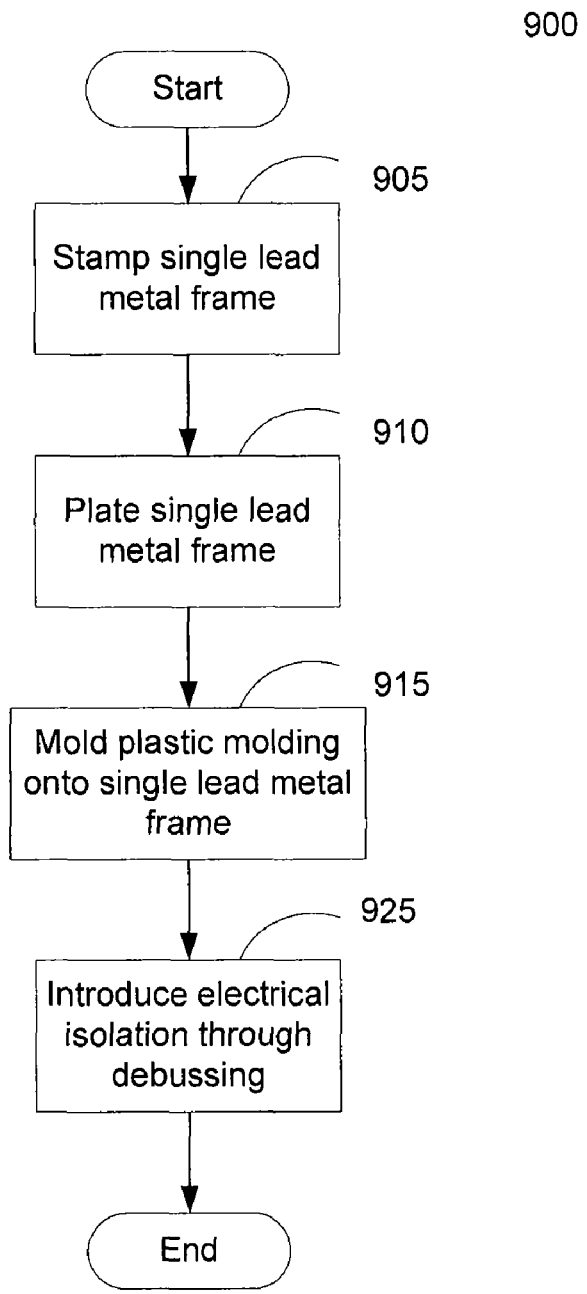
FIG. 9 is a flow diagram of a process of producing a single-lead frame CPV solar cell package in accordance with an aspect of the present invention.

FIG. 9 is an exemplary flow diagram of a method 900 according to an embodiment of the present invention. The method 900 includes steps that can be performed in manufacturing the single-lead frame 200 or 200'. Although the steps of the method 900 will be described with respect to the single-lead frame 200, the method 900 is not limited to the single-lead frame 200, and is merely an exemplary embodiment in accordance with the present invention.

According to the method 900, the single-lead metal frame 210 is stamped (step 905), and then plated (step 910). As noted above, in an exemplary embodiment of the present invention, the plating metal that is used may be nickel for most of the frame 210, and gold for the pads 204. Next, a plastic is molded onto the single-lead metal frame 210 (step 915). After the plastic has been molded onto the single-lead metal frame 210, electrical isolations are introduced within the single-lead metal frame 210 through a process such as debussing (step 925). At this point, the single-lead frame 200 is ready for the mounting of electrical components and encapsulation process in forming a CPV solar cell.

Figure 10:
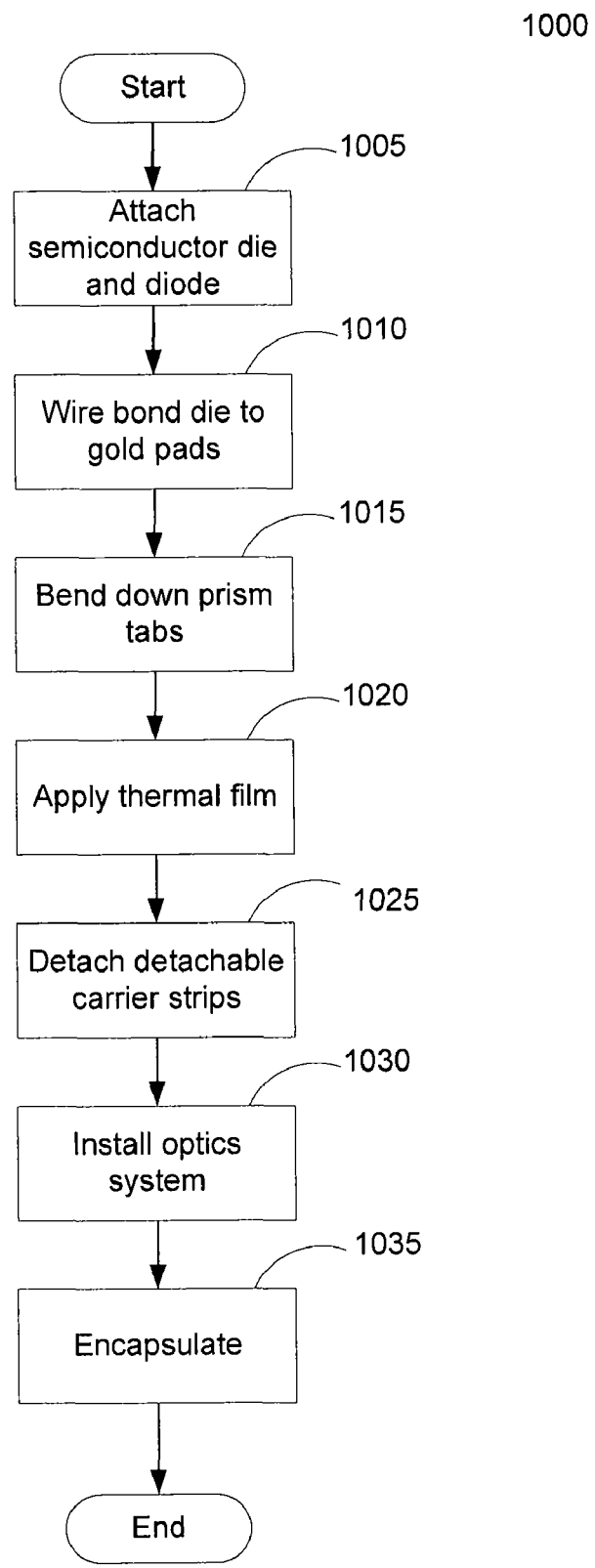
FIG. 10 is a flow diagram of a process of producing a lead frame CPV solar cell in accordance with another aspect of the present invention.

FIG. 10 is an exemplary flow diagram of a method 1000 according to an embodiment of the present invention that may optionally be performed after the completion of the method 800 or 900. The method 1000 includes the additional steps of manufacturing the dual-lead frame 100 or the single-lead frames 200 or 200' into a CPV solar cell. Although the steps of the method 1000 will be described with respect to assembling the dual-lead frame 100 into a CPV solar cell, the method is not limited to assembling a CPV solar cell from the dual-lead frame 100, and may be implemented, for example, in assembling a CPV solar cell from the single-lead frames 200 or 200'.

In assembling the dual-lead frame 100 into a CPV solar cell, the semiconductor die 110 and the diode 114 are mounted onto the dual-lead frame 100 (step 1005). The semiconductor die 110 may be mounted in the recess 106, and the diode may be mounted onto pad 112. After the semiconductor die 110 has been mounted onto the dual-lead frame 100, electrical connections are wire bonded from the semiconductor die 110 to the pads 108 of the dual-lead frame 100 (step 1010). As described above, each wire bonded connection may be made up of a plurality of individual wires. Next, the prism mounting tabs 118 are bent down in preparation for installation of an optics system (step 1015). Subsequently, a thermal film is applied to the underside of the dual-lead frame 100 to aid in thermal dissipation of the assembled solar cell (step 1020). Finally, the carrier strips 508 and 606 are removed from the die pad lead frame 102 and the wire bond lead frame 104, the optics system is installed, and the entire assembly is encapsulated in a thermoplastic mold (steps 1025 through 1035).

Figure 11:
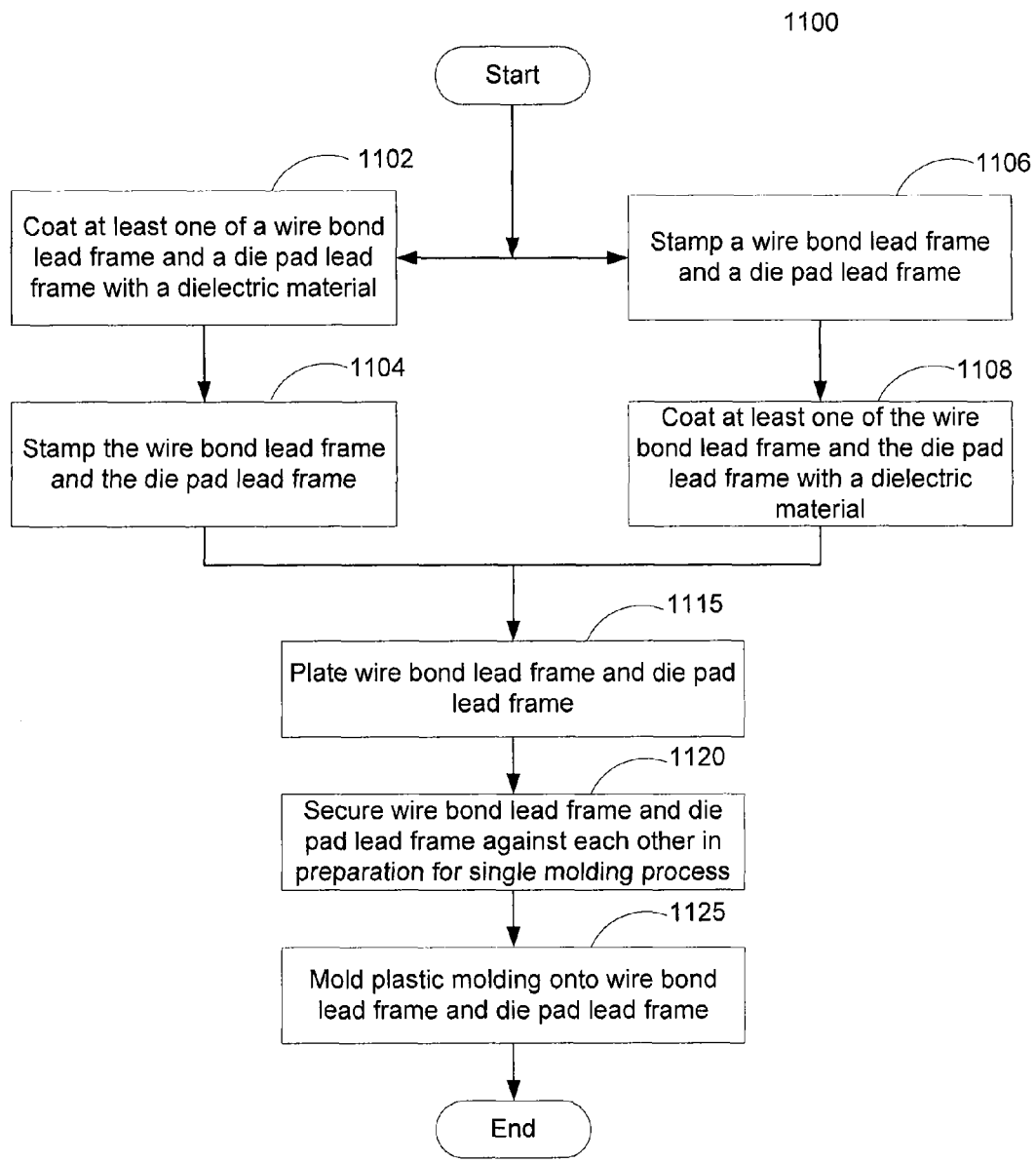
FIG. 11 is a flow diagram of a process of producing a dual lead frame CPV solar cell package in accordance with an aspect of the present invention.

FIG. 11 is an exemplary flow diagram of a method 1100 according to an embodiment of the present invention. The method 1100 describes steps that can be performed in manufacturing a dual-lead frame according to an alternative embodiment of the present invention. According to the method 1100, at least one of the die pad lead frame and the wire bond lead frame is coated with a dielectric material. The dielectric coating provides electrical isolation between the two lead frames, simplifying the manufacturing process. Further, the method 1100 includes a single molding process, further simplifying the manufacturing process.

According to the method 1100, the die pad lead frame and the wire bond lead frame, at least one of the die pad lead frame and the wire bond lead frame is coated in a dielectric material (step 1102 or step 1108) and stamped (step 1104 or step 1106). The two paths of the method 1100 shows that the dielectric coating can being applied (step 1102) prior to stamping the lead frames (step 1104), or alternatively, that the lead frames may be stamped (step 1106) prior to being coated with a dielectric material (step 1108). Preferably, the die pad lead frame may be thicker and may include a more thermally conductive material than the die pad lead frame 102. Subsequently, the lead frames are coated with die and wire bondable coatings (step 1115). Next, the lead frames are held together in preparation for a molding process (step 1120), and a plastic molding is molded onto the lead frames (step 1125), securing the lead frames together.

Thus, while there have been shown, described, and pointed out fundamental novel features of the invention as applied to several embodiments, it will be understood that various omissions, substitutions, and changes in the form and details of the illustrated embodiments, and in their operation, may be made by those skilled in the art without departing from the spirit and scope of the invention. Substitutions of elements from one embodiment to another are also fully intended and contemplated. The invention is defined solely with regard to the claims appended hereto, and equivalents of the recitations therein.

We claim:

1. A dual-lead frame mounting package for an optical semiconductor die, the dual lead frame mounting package having a top surface and a bottom surface, the dual lead frame mounting package comprising:
   a die-pad lead frame having a bonding area for the optical semiconductor die, the die-pad lead frame having an exposed base along the bottom surface for heat dissipation;
   a wire bond lead frame having at least one pad for wire bonding electrical interconnections to the optical semiconductor die;
   an electrically insulative frame disposed in aligned relation between the die-pad lead frame and the wire bond lead frame; and
   a thermoplastic molding at least partially encapsulating the die-pad lead frame, the insulative frame and the wire bond lead frame, wherein at least one of the die pad lead frame and the wire bond lead frame includes at least one mounting structure for mounting an optical structure above the top surface of the dual lead frame mounting package, and wherein the thermoplastic molding, the wire bond lead frame and the insulative frame each define an opening above the bonding area so as to form a recess that extends from the top surface to the bonding area.

2. The dual-lead frame mounting of claim 1, wherein the electrically insulative frame is a plastic frame disposed between the die-pad lead frame and the wire bond lead frame so as to provide electrical isolation between the die-pad lead frame and the wire bond lead frame.

3. The dual-lead frame mounting of claim 1, wherein at least one of the die-pad lead frame and the wire bond lead frame is coated with a dielectric material.

4. The dual-lead frame mounting package of claim 3, wherein the dielectric coating includes at least one of a tape based coating, a powder based coating, and an ink based coating.

5. The dual-lead frame mounting package of claim 1, wherein the die-pad lead frame and the wire bond lead frame are coupled via the thermoplastic molding.

6. The dual-lead frame mounting package of claim 1, wherein the at least one mounting structure includes a recess, a well, or at least one mounting tab extending from the die pad lead frame or the wire bond lead frame.

7. The dual-lead frame mounting package of claim 1, wherein the optical structure includes at least one of a lens, a Fresnel lens, a reflector.

8. The dual-lead frame mounting package of claim 1, wherein at least one of the die-pad lead frame and the wire bond lead frame includes a detachable carrier strip.

9. The dual-lead frame mounting package of claim 1, wherein at least one of the die-pad lead frame and the wire bond lead frame is plated with a metal.

10. The dual-lead frame mounting package of claim 1, wherein the exposed base for heat dissipation is configured to be mounted to an external heat dissipation system.

11. The dual-lead frame mounting package of claim 1 further including:
    an optical semiconductor die mounted to the bonding area of the die-pad lead frame, wherein the optical semiconductor die is a solar cell or a light emitting diode.

12. The dual-lead frame mounting package of claim 11 wherein the optical semiconductor die is a concentrated photovoltaic solar cell.

13. The dual-lead frame mounting package of claim 12 wherein the die-pad lead frame or the wire bond lead frame includes at least one component pad for electrical connection of an electrical component.

14. The dual-lead frame mounting package of claim 13 wherein the electrical component is a diode.

15. The dual-lead frame mounting package of claim 11 wherein the at least one mounting structure includes a recess, a well, or mounting tabs formed within the mounting package.

16. The dual-lead frame mounting package of claim 11 further including the optical structure, wherein the optical structure includes a lens, a Fresnel lens or a reflector mounted to the dual-lead mounting package via the mounting structure and extending above the top surface of the dual-lead frame mounting package.

17. A dual-lead frame mounting package for an optical semiconductor die, comprising:
    a die-pad lead frame having a die-pad bonding area configured to receive the semiconductor die and an exposed base for heat dissipation;
    a wire bond lead frame having at least one pad for wire bonding electrical interconnections to the semiconductor die, the wire bond lead frame being coupled to the die-pad lead frame, each of the die-pad lead frame and the wire bond lead frame having a detachable carrier strip formed as a single piece with the respective lead frame;
    an electrically insulative frame disposed between and in aligned relation with the die-pad lead frame and the wire bond lead; and
    a thermoplastic molding at least partially encapsulating the die-pad lead frame, the insulative frame and the wire bond lead frame, wherein at least one of the die-pad lead frame and the wire bond lead frame includes at least one mounting structure for mounting an optical structure above the top surface of the dual lead frame mounting package and wherein, the thermoplastic molding, the wire bond lead frame and the insulative frame each define an opening above the bonding area so as to form a recess that extends from the top surface to the bonding area.

* * * * *